United States Patent [19]

Nakai et al.

[11] Patent Number: 6,069,518
[45] Date of Patent: May 30, 2000

[54] SEMICONDUCTOR DEVICE ALLOWING GENERATION OF DESIRED INTERNAL VOLTAGE AT HIGH ACCURACY

[75] Inventors: Hiroaki Nakai; Shinichi Kobayashi; Motoharu Ishii; Atsushi Ohba; Tomoshi Futatsuya; Akira Hosogane, all of Hyogo, Japan

[73] Assignee: Mitsubishi Denki Kabushiki Kaisha, Tokyo, Japan

[21] Appl. No.: 08/352,143

[22] Filed: Dec. 1, 1994

[30] Foreign Application Priority Data

Feb. 15, 1994 [JP] Japan .................................. 6-018481

[51] Int. Cl.[7] ...................................................... G05F 1/10
[52] U.S. Cl. .......................................... 327/535; 327/540
[58] Field of Search ..................................... 327/536, 537, 327/538, 540, 541, 543, 589, 535, 534; 331/57; 307/110

[56] References Cited

U.S. PATENT DOCUMENTS

| | | | |
|---|---|---|---|
| 4,439,692 | 3/1984 | Beekmans et al. ..................... | 327/536 |
| 4,843,256 | 6/1989 | Scade et al. ............................. | 327/536 |
| 5,347,172 | 9/1994 | Cordoba et al. ........................ | 327/536 |
| 5,396,114 | 3/1995 | Lee et al. ................................ | 327/538 |
| 5,432,738 | 7/1995 | Watsuji et al. ..................... | 365/189.01 |

OTHER PUBLICATIONS

"A Quick Intelligent Program Architecture For 3V–Only Nand–EEPROMS", Tanaka et al., 1992 Symposium on VLSI Circuits Digest of Technical Papers.

*Primary Examiner*—Jung Ho Kim
*Attorney, Agent, or Firm*—McDermott, Will & Emery

[57] ABSTRACT

In response to complementary clock signals provided from a driver, a charge pump operates to provide an output voltage which is a down-converted negative voltage. The voltage between this output voltage and a predetermined positive reference voltage is capacitance-divided by capacitors. The capacitance-divided positive voltage is applied to a comparator, whereby a reference voltage is compared with the above positive voltage. An output signal of the comparator is applied to the driver. In response, the driver controls the operation of the charge pump, whereby the output voltage is clamped at a predetermined voltage level for output.

17 Claims, 10 Drawing Sheets

SEMICONDUCTOR DEVICE ALLOWING GENERATION OF DESIRED INTERNAL VOLTAGE AT HIGH ACCURACY

BACKGROUND OF THE INVENTION

1. Field of the Invention

The present invention relates to semiconductor devices, and more particularly, to a semiconductor device including a charge pump circuit for generating a predetermined internal voltage from an externally applied power supply voltage.

2. Description of the Background Art

Semiconductor devices such as flash memories that carried out data writing, reading, and erasing electrically generate internally a plurality of voltages other than the externally applied power supply voltage to carry out the above operations according to these internal voltages. For example, a flash memory has a memory cell formed by one transistor, wherein a drain is connected to a bit line and a control gate is connected to a word line. In an erasing operation, a positive high voltage is applied to a control gate of a transistor serving as a memory cell, and a negative high voltage is applied to a source and a P well thereof, whereby electrons are injected into a floating gate taking advantage of tunneling phenomenon. In a writing operation, a negative high voltage is applied to the control gate, and a positive high voltage is applied to the drain, whereby electrons are drawn out from the floating gate according to tunneling phenomenon.

Various internal voltages used in each operation of a conventional flash memory will be described hereinafter. FIG. 11 is a diagram for explaining voltages applied to memory cells in selected and de-selected sectors under various operations of a flash memory.

Referring to FIG. 11, a source voltage Vs is −8V, a control gate voltage Vcg is 10V, a P well voltage BG is −8V, and a drain voltage Vd is floating, for example, in an erasing operation. In the following, a memory cell of a selected sector and a de-selected sector has predetermined voltages applied including a source voltage Vs, a control voltage Vcg, a drain voltage Vd, and a P well voltage BG to carry out respective operations as shown in FIG. 11. When there is only a single externally applied power supply voltage, for example only 3V, a positive voltage generation circuit and a negative voltage generation circuit generally include a charge pump circuit for generating various voltages of 6V, 10V, 4V, −8V, and −4V on the basis of the single power supply voltage.

A positive voltage generation circuit and a negative voltage generation circuit used in the above-described conventional flash memory will be described hereinafter with reference to the drawings. FIG. 12 shows a structure of a conventional positive voltage generation circuit.

Referring to FIG. 12, a positive voltage generation circuit includes a positive voltage charge pump circuit 101, an oscillator 102, a drive circuit 103, and a Zener diode D1.

Positive voltage charge pump circuit 101 includes NMOS transistors Q201–Q212, and capacitors C201–C210. Transistors Q201–Q210 are diode-connected, and also connected to capacitors C201–C210.

Oscillator 102 receives a control signal OSC to provide a clock signal of a predetermined frequency to drive circuit 103. Drive circuit 103 responds to a clock signal from oscillator 102 to provide clock signals $\phi p$ and $/\phi p$ ("/" implies an invert signal) complementary to each other. Positive voltage charge pump circuit 101 has a node N1 charged to $V_{CC}-V_{th}$ ($V_{CC}$ is power supply voltage, and $V_{th}$ is threshold voltage of transistor), which is then raised in response to clock signal $\phi p$. Next, transistor Q201 is turned on, whereby the potential of a node N2 rises. When, clock signal $/\phi p$ attains a H level (logical high), the potential of node N2 further rises. As a result, positive voltage charge pump circuit 101 can generate a voltage higher than a power supply voltage $V_{CC}$ by sending charges in capacitors C201–C210 sequentially to a succeeding stage. The generated high voltage $V_{PP}$ is clamped at a predetermined potential by Zener diode D1. According to the above-described operation, a high voltage $V_{PP}$ greater than power supply voltage $V_{CC}$ can be output at a predetermined potential level in response to control signal OSC. By using such a positive voltage generation circuit, a conventional flash memory carries out various operations of a memory cell according to internally generated voltages from a power supply voltage $V_{CC}$.

A conventional negative voltage generation circuit will be described hereinafter with reference to FIG. 13 showing a structure thereof.

Referring to FIG. 13, a negative voltage generation circuit includes a negative voltage charge pump circuit 104, an oscillator 105, a drive circuit 106, and a Zener diode D2. Negative voltage charge pump circuit 104 includes PMOS transistors Q221–Q231, and capacitors C221–C230.

Transistors Q221–Q230 are diode-connected, and also connected to capacitors C221–C230.

Oscillator 105 and drive circuit 106 operate in a manner similar to oscillator 102 and drive circuit 103 of FIG. 12. Complementary clock signals $\phi n$ and $/\phi n$ are provided to negative voltage charge pump circuit 104. Similar to the operation of the above-described positive voltage charge pump circuit, negative voltage charge pump circuit 104 provides a negative voltage $NV_{PP}$ which is clamped at a predetermined voltage level by Zener diode D2. By means of such a negative voltage generation circuit, a conventional flash memory supplies predetermined negative voltages, for example, to a memory cell according to respective operation modes.

Conventional positive and negative voltage generation circuits had problems set forth in the following since a voltage generated from a charge pump circuit is clamped at a predetermined level by a clamping voltage of a Zener diode.

The clamping voltage of a Zener diode is too fluctuating as a result of incidental variations in the manufacturing process thereof. Therefore, a desired positive voltage or a negative voltage could not be provided accurately. Furthermore, an output clamp could not be achieved if the current flow is too low in a clamping operation by a Zener diode. Therefore, this imposed a great load on a charge pump circuit having the current supplying ability limited. There was a also problem of increasing the cost due to a dedicated mask required in forming a Zener diode on a semiconductor substrate.

FIG. 14 is a diagram showing structures of a Zener diode and a P channel transistor. In a clamping method using a Zener diode, it is necessary to set the injection amount towards a P+ diffusion layer according to a desired clamping level since the voltage to be clamped varies on the basis of the junction characteristic of a Zener diode. For example, when a Zener diode is formed by a PN junction of a P+ diffusion layer and an N well layer, the injection amount into the P+ diffusion layer must be specified so that a desired breakdown voltage is obtained. However, this injection amount differs from that towards a P+ diffusion layer of a p channel transistor. It is therefore necessary to provide injection differing in amount towards the P+ diffusion layers of a P channel transistor and a Zener diode by means of an additional mask for P+ injection for a Zener diode. This additional mask for forming a Zener diode results in increasing the complexity of the manufacturing process and the cost thereof.

SUMMARY OF THE INVENTION

An object of the present invention is to provide a semiconductor device that can output a desired internal voltage at high accuracy without expending extra current and that can have the manufacturing process simplified.

Another object of the present invention is to provide a semiconductor device that can supply an internal voltage using a single power supply voltage, differing in polarity from that of the power supply voltage.

A further object of the present invention is to provide a semiconductor device that can supply stable and accurate negative and positive internal voltages using a single positive power supply voltage.

According to an aspect of the present invention, a semiconductor device includes a charge pump circuit for generating a first voltage of a first polarity, a voltage generation circuit for generating a second voltage of a second polarity different from the first polarity, a voltage divider for generating a third voltage of the second polarity by voltage-division from the first voltage and the second voltage, and a control circuit for controlling the operation of the charge pump circuit according to the level of the third voltage.

Because the operation of the charge pump circuit is controlled according to the level of the third voltage of the second polarity which is obtained by voltage-division from the first voltage of the first polarity provided from the charge pump circuit and the second voltage of the second polarity provided from the second voltage generation circuit, it is possible to control the operation of the charge pump circuit using only the voltage of a polarity different from that of the voltage provided from the charge pump circuit.

As a result, the semiconductor device of the present invention can output a desired internal voltage at high accuracy and simplify the manufacturing process thereof without using a Zener diode and without expending extra current.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
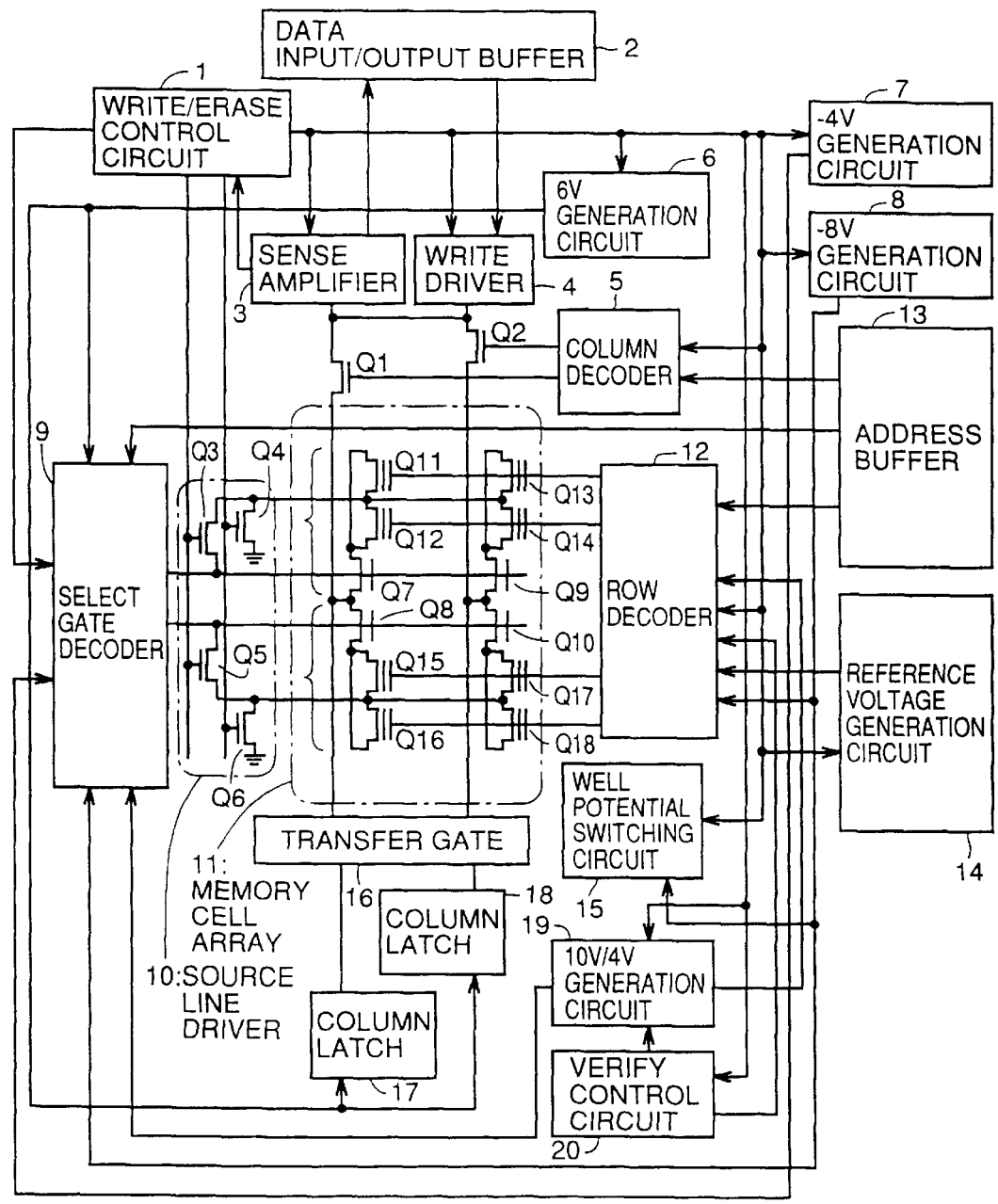
FIG. 2 is a block diagram showing a structure of a semiconductor device according to an embodiment of the present invention.

An embodiment of a semiconductor device according to the present invention will be described hereinafter with reference to FIG. 2 showing a structure thereof. Although a DINOR (Divided-bit line NOR) type flash memory having a structure in which the main bit line is divided into sub bit lines is shown in FIG. 2, the present invention is applicable to any semiconductor device that generates a desired internal voltage by a charge pump circuit.

Referring to FIG. 2, a flash memory includes a write/erase control circuit 1, a data input/output buffer 2, a sense amplifier 3, a write driver 4, a column decoder 5, a 6V generation circuit 6, a −4V generation circuit 7, a −8V generation circuit 8, a select gate decoder 9, a source line driver 10, a memory cell array 11, a row decoder 12, an address buffer 13, a reference voltage generation circuit 14, a well potential switching circuit 15, a transfer gate 16, column latches 17 and 18, a 10V/4V generation circuit 19, a verify control circuit 20, and Y gate transistors Q1 and Q2. For the sake of simplification, the memory cell array in one sector has a 2×2 arrangement in FIG. 2.

Write/erase control circuit 1 controls the timing of writing and erasing operations and the voltage at each operation. Data input/output buffer 2 provides data from sense amplifier 3 to an external source, or provides an externally applied write data to write driver 4. Sense amplifier 3 amplifies and provides to input/output buffer 2 data in a memory cell within memory cell array 11 input via Y gate transistors Q1 and Q2. Write driver 4 gives data inputs from data input/output buffer 2 into column latches 17 and 18. Column decoder 5 selects Y gate transistors Q1 and Q2 in response to an output from address buffer 13. 6V generation circuit 6 provides a voltage of 6V to column latches 17 and 18, and they provide 6V to bit line corresponding to data "0". −4V generation circuit 7 provides a voltage of −4V to the source of a de-selected memory cell in an erasing operation. −8V generation circuit 8 provides a voltage of −8V to a word line and row decoder 12 in a writing operation, and to a P well and the source of a selected memory cell in an erasing operation. Select gate decoder 9 selects select gates Q7–Q10 in memory cell array 11 in response to an output from address buffer 13. Source line driver 10 includes NMOS transistors Q3–Q6. Source line driver 10 applies a voltage of a ground level in a reading operation and a negative voltage in an erasing operation to the source line of a memory cell. Memory cell array 11 includes memory cells Q11–Q18, and select gates Q7–Q10. Memory cell array 11 has data written and erased with respect to a memory cell selected by row decoder 12 and column decoder 5. Row decoder 12 selects a predetermined word line in response to an output from address buffer 13. Address buffer 13 receives an externally applied address signal for selecting a predetermined memory cell in memory cell array 11. Address buffer 13 provides a column address signal to column decoder 5 and a row address signal to row decoder 12. Reference voltage generation circuit 14 provides a word line voltage in a write verify operation, and a reference voltage for 6V, 10V/4V, –8V and –4V generation circuits 6, 19, 8 and 7. Well potential switching circuit 15 applies a high negative voltage to a P well in an erasing operation of a memory cell, and connects the P well to ground in other operation modes. Transfer gate 16 controls the connection between column latches 17, 18 and bit lines. Column latches 17 and 18 latch write data. 10V/4V generation circuit 19 provides a voltage of 10V to select gate decoder 9 in a writing operation, a voltage of 10V to a word line and row decoder 12 in an erasing operation, and a voltage of 4V dropped from 10V to a word line and row decoder 12 in an erase verify operation. Verify control circuit 20 controls the operation of each circuit in a verify operation.

Figure 1:
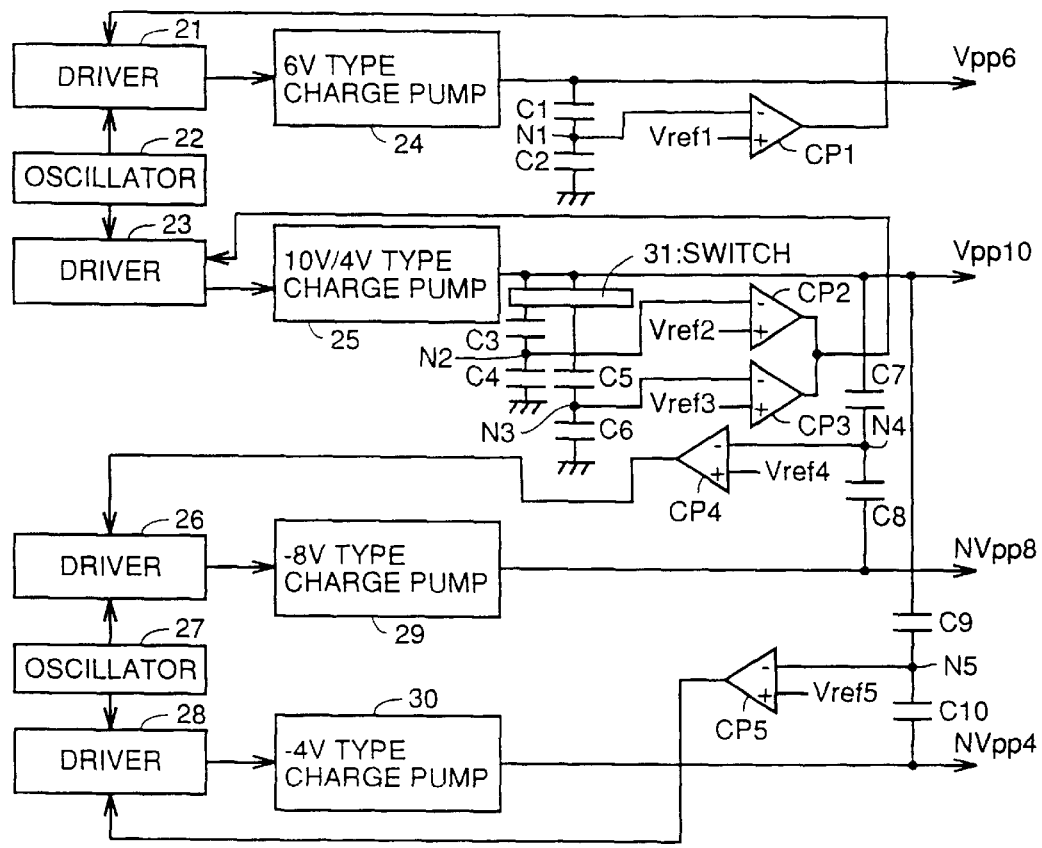
FIG. 1 is a block diagram showing a structure of an internal voltage generation unit of a semiconductor device shown in FIG. 2.

An internal voltage generation unit will be described in detail hereinafter including 6V generation circuit 6, –4V generation circuit 7, 8V generation circuit 8, and 10V/4V generation circuit 19 shown in FIG. 2. FIG. 1 is a block diagram showing a structure of the internal voltage generation unit of the semiconductor device shown in FIG. 2.

Referring to FIG. 1, an internal voltage generation unit includes drivers 21, 23, 26 and 28, oscillators 22 and 27, a 6V type charge pump 24, a 10V/4V charge pump 25, a –8V type charge pump 29, a –4V type charge pump 30, comparators CP1–CP5, capacitors C1–C10, and a switch 31.

Oscillator 22 receives a control signal for instructing an oscillation operation, and provides a clock signal of a predetermined frequency to driver 21 in response to this control signal. When the output of comparator CP1 attains a H level, driver 21 responds to a clock signal from oscillator 22 to provide complementary clock signals to 6V type charge pump 24. 6V type charge pump 24 provides a boosted high voltage $V_{PP6}$ in response to input clock signals complementary to each other. High voltage $V_{PP6}$ is subjected to capacitance-division by capacitors C1 and C2, whereby the potential of node N1 is applied to comparator CP1. Capacitors C1 and C2 include, for example, an MOS capacitor or a parallel plate type capacitor. This also applies to the following capacitor used in capacitance-division. A reference voltage Vref1 from a reference voltage generation circuit (not shown) is applied to comparator CP1. Here, the level of reference voltage Vref1 is set to Vref1=Vclamp6·C1 (C1+C2) where Vclamp6 is a clamping voltage, and C1 and C2 are capacitances of capacitors C1 and C2, respectively. Therefore, when $V_{PP6}$=Vclamp6, the potential of node N1 is equal to reference voltage Vref1. When output voltage $V_{PP6}$ rises, the output signal of comparator CP1 is brought to a L level (logical low) from a H level to be provided to driver 21. Driver 21 responds to an "L" output signal of comparator CP1 to suppress output of complementary clock signals, whereby 6V type charge pump 24 ceases a boosting operation. This causes the level of voltage $V_{PP6}$ to drop. When $V_{PP6}$<Vclamp6, the output signal of comparator CP1 rises to a H level, whereby driver 21 provides complementary clock signals to 6V type charge pump 24 again. 6V type charge pump 24 responds to these input complementary clock signals to reinitiate a boosting operation, whereby output $V_{PP6}$ is boosted to a high level. By repeating the above operation, the level of output voltage $V_{PP6}$ of 6V type charge pump 24 is clamped at the level of clamping voltage Vclamp6. Here, clamp voltage Vclamp6 is set to 6V since it is necessary to obtain an output voltage $V_{PP6}$ of 6V from 6V type charge pump 24.

Because the voltage of node N1 is generated by capacitance-division of capacitors C1 and C2, excessive current will not flow since a direct current path is not generated from output voltage $V_{PP6}$ to ground potential. Therefore, output voltage $V_{PP6}$ can be clamped at high accuracy even if a charge pump circuit limited in current supplying ability is used. Also, power consumption is reduced. It is desirable to set the capacitances of capacitors C1 and C2 as low as possible because the voltage of node N1 is determined depending on the capacitance ratio of capacitor C1 to capacitor C2. The capacitances of capacitors C1 and C2 are preferably set lower than that of the capacitor used in a charge pump circuit. This also applies to the capacitance-division of the following capacitors.

Although output voltage $V_{PP6}$ of 6V type charge pump 24 is subjected to capacitance-division in the above embodiment, the voltage of node N1 may be generated by resistance-division when the current supplying ability of the charge pump circuit is not so low.

Oscillator 22 also provides a clock signal of a predetermined frequency to driver 23. Driver 23 responds to an input clock signal to provide complementary clock signals to 10V/4V type charge pump 25. 10V/4V type charge pump 25 provides a voltage $V_{PP10}$ boosted to a high level. Output voltage $V_{PP10}$ is capacitance-divided by capacitors C3 and C4, or by capacitors C5 and C6. This is to clamp output voltage $V_{PP10}$ to a 4V level or a 10V level appropriately. More specifically, it is necessary to provide a voltage of 4V dropped down from the level of 10V to a word line and row decoder 12 in an erase verify mode. The switching between capacitors C3 and C4, and capacitors C5 and C6 is carried out by switcher 31. If capacitors C3 and C4 are to be used for clamping a voltage at the level of 4V, switcher 31 selects the capacitor C3 side in an erase verify operation. In a writing or erasing operation, the capacitor C5 side is selected. More specifically, comparator CP3 is activated and comparator CP2 is deactivated in clamping a voltage of 10V. In clamping a voltage of 4V, comparator CP2 is activated and comparator CP3 is deactivated. Comparators CP2 and CP3 will not be activated at the same time. The voltage of node N2 is applied to comparator CP2. Comparator CP2 has a reference voltage Vref2 applied thereto. Reference voltage Vref2 is set to Vref2=Vclamp4·C3/(C3+C4). Here, Vclamp4 is the clamping voltage in a 4V clamping operation. Comparator CP2, driver 23, and 10V/4V type charge pump 25 operate in a manner similar to the above to clamp output voltage $V_{PP10}$ at the level of 4V. The voltage of node N3 is applied to comparator CP3. A reference voltage Vref3 set to Vref3=Vclamp10·C5/(C5+C6) is applied to comparator CP3 which operates in a similar manner. Thus, output voltage $V_{PP10}$ is clamped at the level of 10V. Here, Vclamp10 is the clamping voltage of a 10V clamping operation.

Oscillator 27 responds to a control signal that instructs an oscillation operation to provide a clock signal of a predetermined frequency to driver 26. When an output signal of comparator 24 attains a L level, driver 26 responds to a clock signal from oscillator 27 to provide complementary clock signals to −8V type charge pump 29. In response, −8V type charge pump 29 down-converts the level of output voltage $NV_{PP8}$. The voltage between output voltage $V_{PP10}$ of 10V/4V type charge pump 25 and output voltage $NV_{PP8}$ of −8V type charge pump 29 is capacitance-divided by capacitors C7 and C8. The capacitances of capacitors C7 and C8 are set so that the capacitance-divided voltage of node N4 is positive. The voltage of node N4 is applied to comparator CP4. A reference voltage Vref4 set to Vref4= (C7·Vclamp10+C8·NVPPclamp8)/(C7+C8) is applied to comparator CP4. Here, NVPPclamp8 is the clamping voltage in a −8V clamping operation. Comparator CP4 compares the voltage of node N4 with reference voltage Vref4. When the voltage of node N4 becomes smaller than reference voltage Vref4, the output signal attains a H level. The output signal of comparator CP4 is applied to driver 26. Driver 26 suppresses output of complementary clock signals when the output signal attains a H level. As a result, −8V type charge pump 29 suppresses its voltage dropping operation. Then, when the voltage of node N4 becomes greater than reference voltage Vref 4, the output signal of comparator CP4 falls to a L level. Driver 26 reinitiates output of complementary clock signals, whereby a dropping operation by −8V type charge pump 29 begins. By the above operation, output voltage $NV_{PP8}$ is clamped at the level of −8V.

Oscillator 27 responds to a control signal instructing an oscillation operation to provide a clock signal of a predetermined frequency to driver 28. Driver 28 responds to an input clock signal to provide complementary clock signals to −4V type charge pump 30. −4V type charge pump 30 responds to the input complementary clock signals to start a voltage-down operation, whereby the level of output voltage $NV_{PP4}$ is dropped. The voltage between output voltage $NV_{PP4}$ and output voltage $V_{PP10}$ of 10V/4V type charge pump 25 is capacitance-divided by capacitors C9 and C10. The capacitances of capacitors C9 and C10 are set so that the voltage of node N5 is positive. The voltage of node N5 is applied to comparator CP5. A reference voltage Vref5 set to Vref5=(C9·Vclamp10+C10·NVPPclamp4)/(C9+C10) is applied to comparator CP5. Comparator CP5, driver 28, and −4V type charge pump 30 operate in a manner similar to the above-described comparator CP4, driver 26, and −8V type charge pump 29, whereby output voltage $NV_{PP4}$ is clamped at the level of −4V.

According to the above-described operation, the internal voltage generation unit of FIG. 1 can clamp positive voltages of output voltages $V_{PP6}$, $V_{PP10}$, and negative voltages $NV_{PP8}$ and $NV_{PP4}$ using only the positive voltages of nodes N1–N5 and reference voltages Vref1–Vref5. Therefore, internal voltages of 6V, 10V, 4V, −8V and −4V can be generated using a single power supply voltage, for example a positive voltage of 3V.

Specific structures of oscillators 22 and 27 of FIG. 1 will be described hereinafter with reference to FIG. 3.

Figure 3:
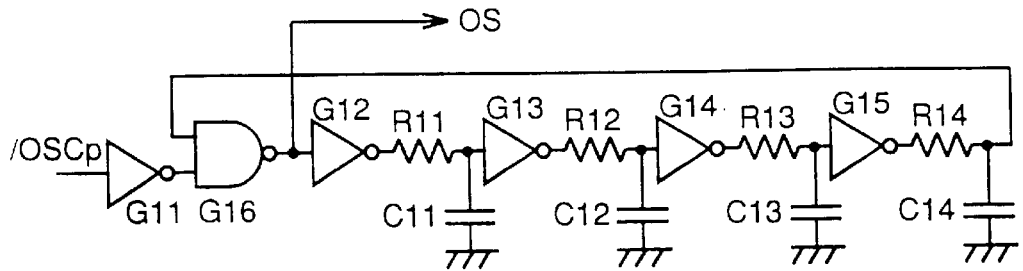
FIG. 3 shows a specific structure of the oscillator of FIG. 1.

Referring to FIG. 3, an oscillator includes resistors R11–R14, inverters G11–G15, capacitors C11–C14, and an NAND gate G16. The oscillator of FIG. 3 forms a ring oscillator, and provides a clock signal OS of a predetermined frequency in response to a control signal /OSCP.

The structures of drivers 21 and 23, and 6V type charge pump 24 and 10V/4V type charge pump 25 which are positive voltage charge pump circuits of FIG. 1 will be described specifically with reference to FIG. 4.

Figure 4:
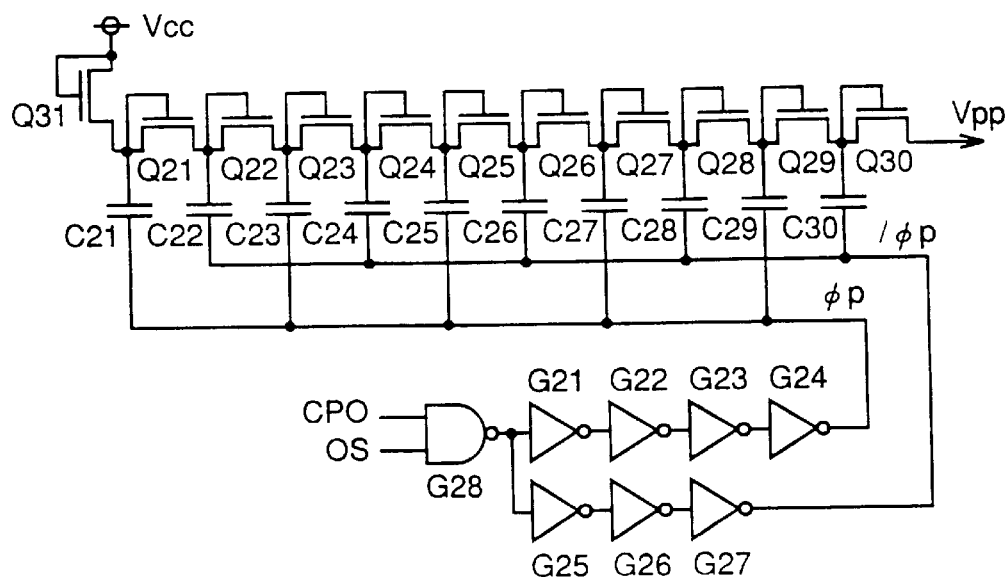
FIG. 4 shows specific structures of the driver and the positive voltage charge pump circuit of FIG. 1.

Referring to FIG. 4, a driver includes an NAND gate G28, and inverters G21–G27. A clock signal OS from the oscillator of FIG. 3 and an output signal CPO of comparators CP1–CP3 of FIG. 1 are applied to NAND gate G28, whereby an invert signal of an AND operation of the two input signals are applied to inverters G21 and G25. Therefore, clock signal OS is inverted only when output signal CP0 of the comparator attains a H level to be provided to inverters G21 and G25. The clock signal provided to inverter G21 is output as a clock signal φp through inverters G21–G24. The clock signal provided to inverter G25 is output as a clock signal /φp through inverters G25–G27. Clock signals φp and /φp are clock signals complementary to each other.

Figure 12:
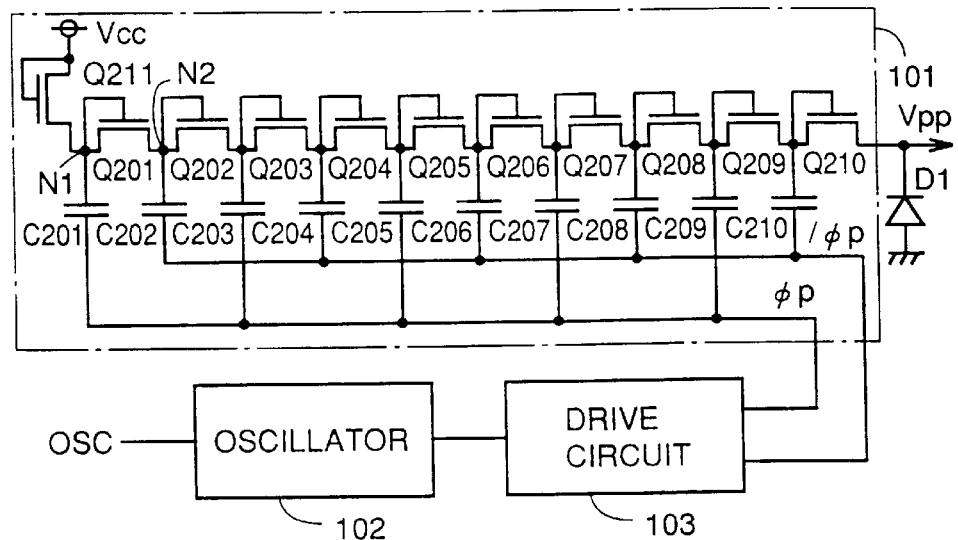
FIG. 12 shows a structure of a conventional positive voltage generation circuit.

A positive voltage charge pump circuit includes NMOS transistors Q21–Q31 and capacitors C21–C30. Diode-connected transistor Q31 is connected to power supply voltage $V_{CC}$. Diode-connected transistors Q21–Q30 are connected to capacitors C21–C30. Clock signal φp is applied to capacitors C21, C23, C25, C27 and C29. Clock signal /φp is applied to capacitors C22, C24, C26, C28 and C30. This positive voltage charge pump circuit operates in a manner similar to the conventional positive voltage charge pump circuit of FIG. 12, and boosts power supply voltage $V_{CC}$ to output a high voltage $V_{PP}$.

Figure 5:
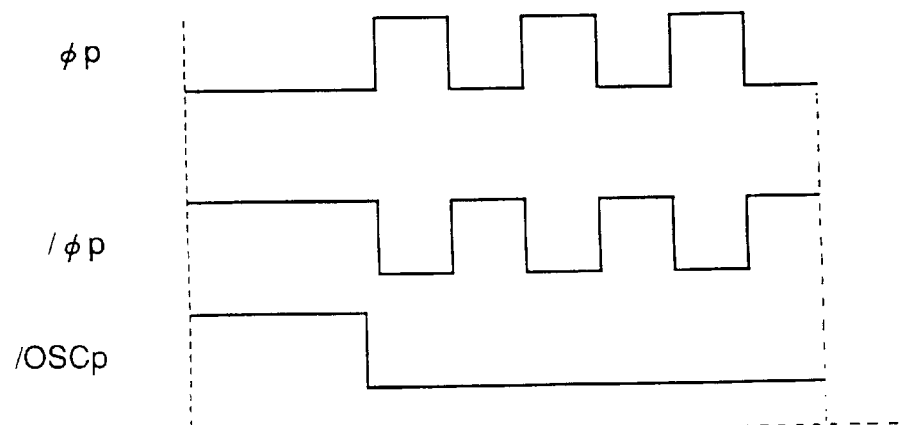
FIG. 5 is a timing chart of output signals of the oscillator of FIG. 3 and the driver of FIG. 4.

The timing of the output signals of the oscillator shown in FIG. 3 and the driver shown in FIG. 4 will be described hereinafter with reference to a timing chart of FIG. 5. When control signal /OSCp is pulled down to a L level from a H level, complementary clock signals φp and /φp are output. The above-described positive voltage charge pump circuit operates in response to these clock signals φp and /φp to boost output voltage $V_{PP}$.

The structures of the comparator of FIG. 1 and a reference voltage generation circuit for generating a reference voltage will be described in detail with reference to FIG. 6.

Figure 6:
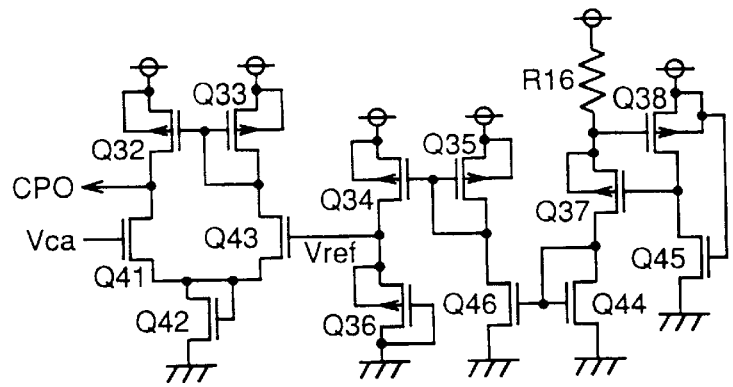
FIG. 6 shows specific structures of the comparator and the reference voltage generation circuit of FIG. 1.

Referring to FIG. 6, a reference voltage generation circuit includes a resistor R16, PMOS transistors Q34–Q38 and NMOS transistors Q44–Q46. The reference voltage generation circuit generates a reference voltage Vref from power supply voltage $V_{CC}$ to provide the same to the comparator.

The comparator includes PMOS transistors Q32 and Q33, and NMOS transistors Q41–Q43. An output voltage Vca which is capacitance-divided by capacitors C1–C10 of FIG. 1 is applied to the gate of transistor Q41. A reference voltage Vref from the reference voltage generation circuit is applied to the gate of transistor Q43. When output voltage Vca>reference voltage Vref, an output signal CPO of a L level is provided. When output voltage Vca<reference voltage Vref, output signal CPO attains a H level.

The structures of drivers 26 and 28, −8V type charge pump 29 and −4V type charge pump 30 which are negative voltage charge pump circuits shown in FIG. 1, will be described in detail with reference to FIG. 7.

Figure 7:
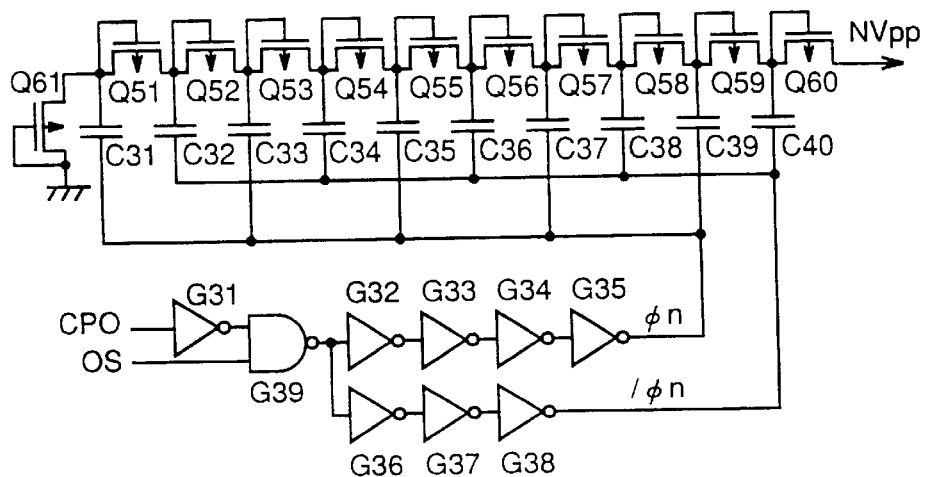
FIG. 7 shows a specific structure of the driver and the negative voltage charge pump circuit of FIG. 1.

Referring to FIG. 7, a driver includes inverters G31–G38, and an NAND gate G39.

An output signal CPO provided from the comparator and the reference voltage generation circuit of FIG. 6 is applied to inverter G31, from which an invert signal is output to NAND gate G39. A clock signal OS of a predetermined frequency from the oscillator shown in FIG. 3 for example, is applied to NAND gate G39. Both signals are ANDed in NAND gate G39 to be inverted and provided to inverters G32 and G36. The signal input to inverter G32 passes through inverters G32–G35 to be output as a predetermined clock signal φn. The signal input to inverter G36 passes through inverters G36–G38 to be output as a clock signal /φn complementary to clock signal φn. By the above-described structure, complementary clock signals φn and /φn are provided in response to a clock signal OS when output signal CPO of the comparator attains a L level.

Figure 13:
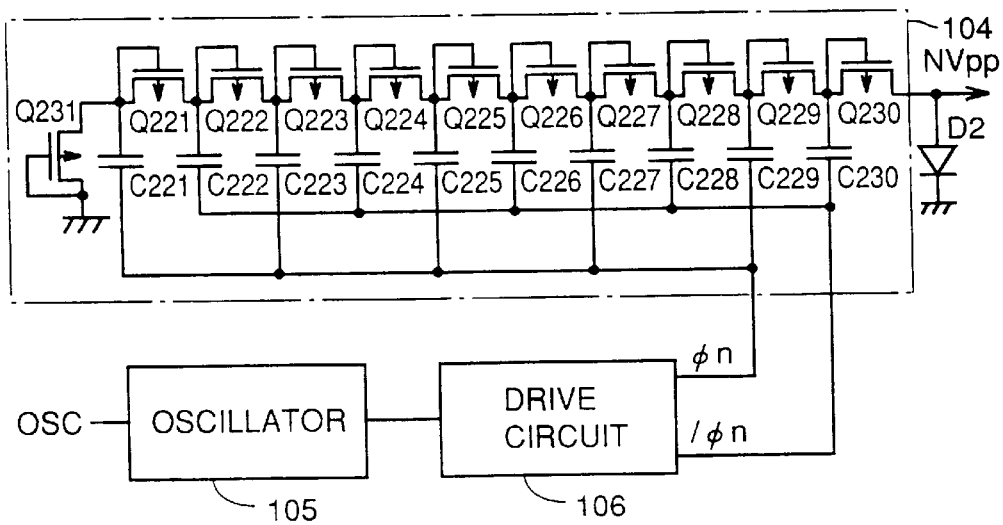
FIG. 13 shows a structure of a conventional negative voltage generation circuit.
Figure 14:
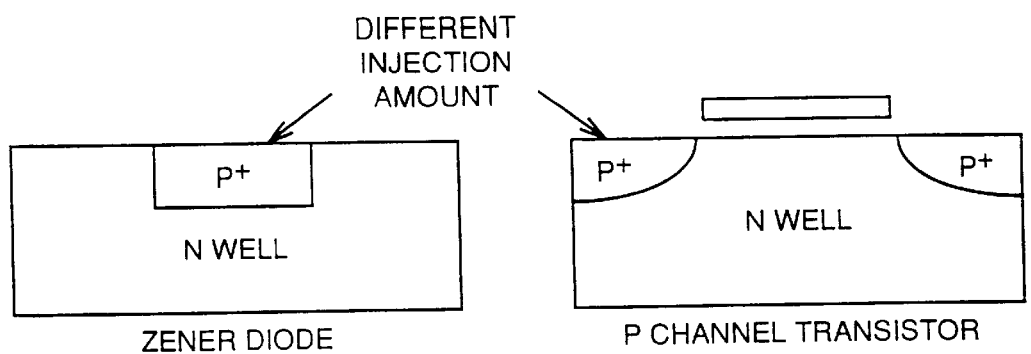
FIG. 14 shows a structure of a Zener diode and a P channel transistor.

A negative voltage charge pump circuit includes PMOS transistors Q51–Q61, and capacitors C31–C40. The negative voltage charge pump circuit of FIG. 7 has a structure similar to that of the conventional negative voltage charge pump circuit of FIG. 13, and operates in a similar manner. More specifically, in response to complementary clock signals φn and /φn, an output voltage $NV_{PP}$ which is a down-converted negative voltage is output.

Figure 8:
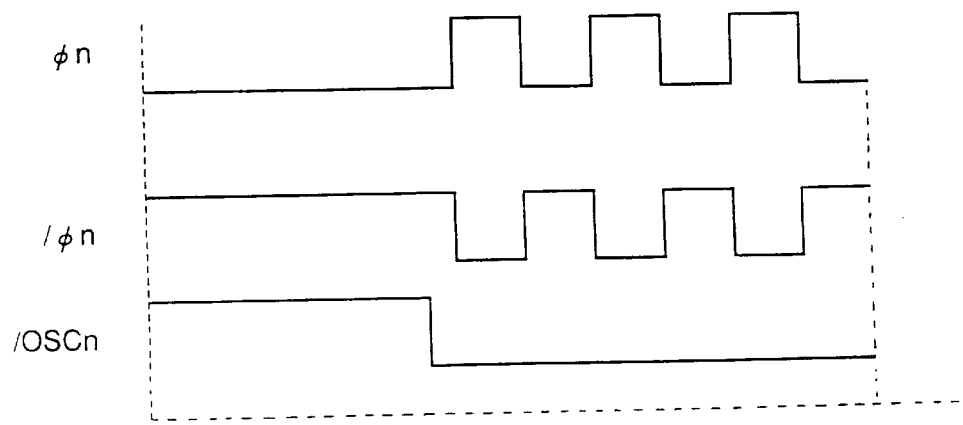
FIG. 8 is a timing chart of output signals of the oscillator for clamping a negative voltage and the driver of FIG. 1.

The timing of the output signals of oscillator 27 and drivers 26 and 28 of FIG. 1 will be described hereinafter with reference to the timing chart of FIG. 8. When an input control signal /OSCn instructing an oscillation operation of oscillator 27 falls from a H level to a L level, complementary clock signals φn and /φn are provided. In response, the negative voltage charge pump circuit of FIG. 7 provides an output voltage $NV_{PP}$ which is a negative down-converted voltage.

Figure 11:
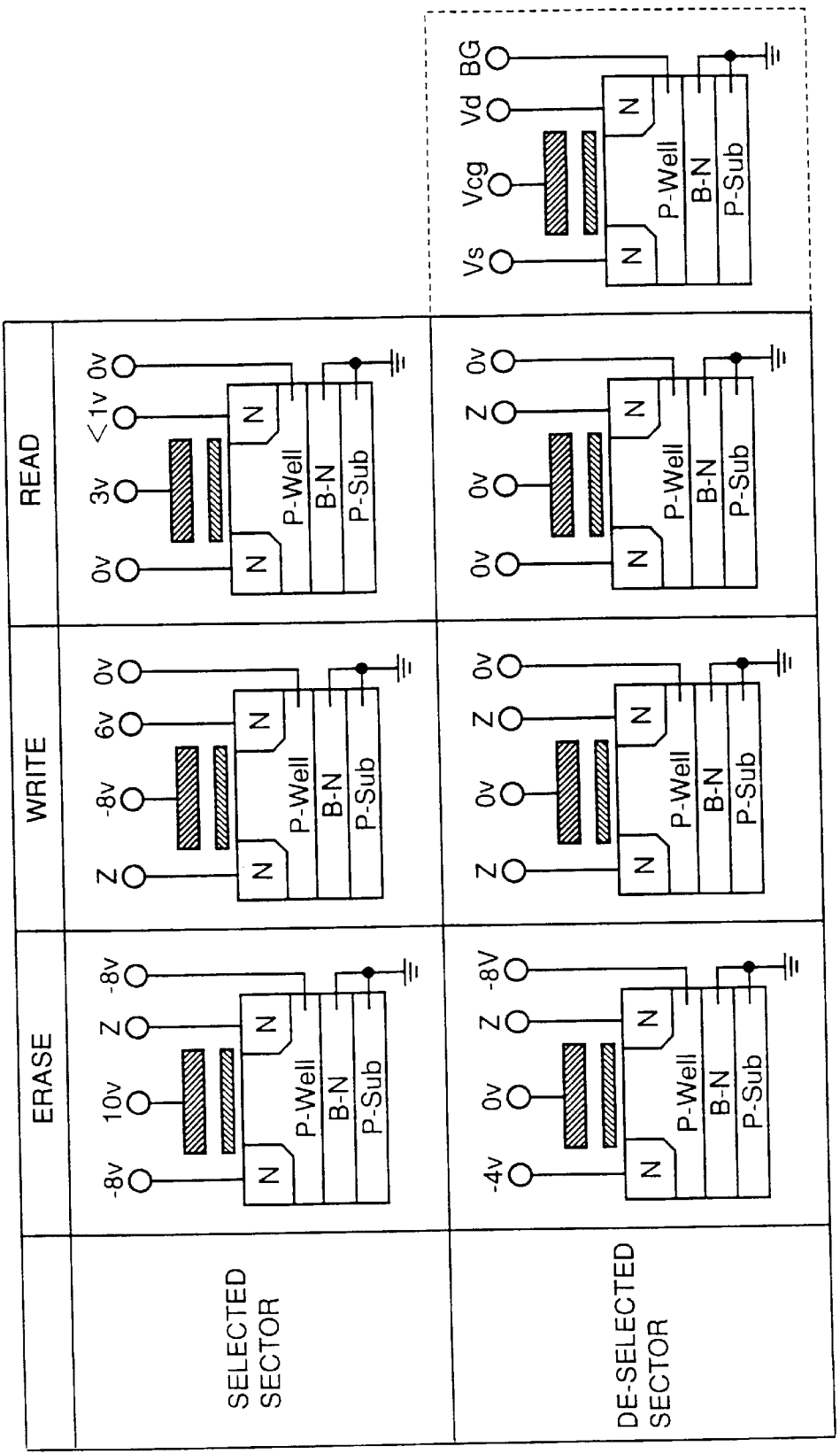
FIG. 11 is a diagram for describing each voltage provided to memory cells of a selected sector and a deselected sector in various operation states.
Figure 15:
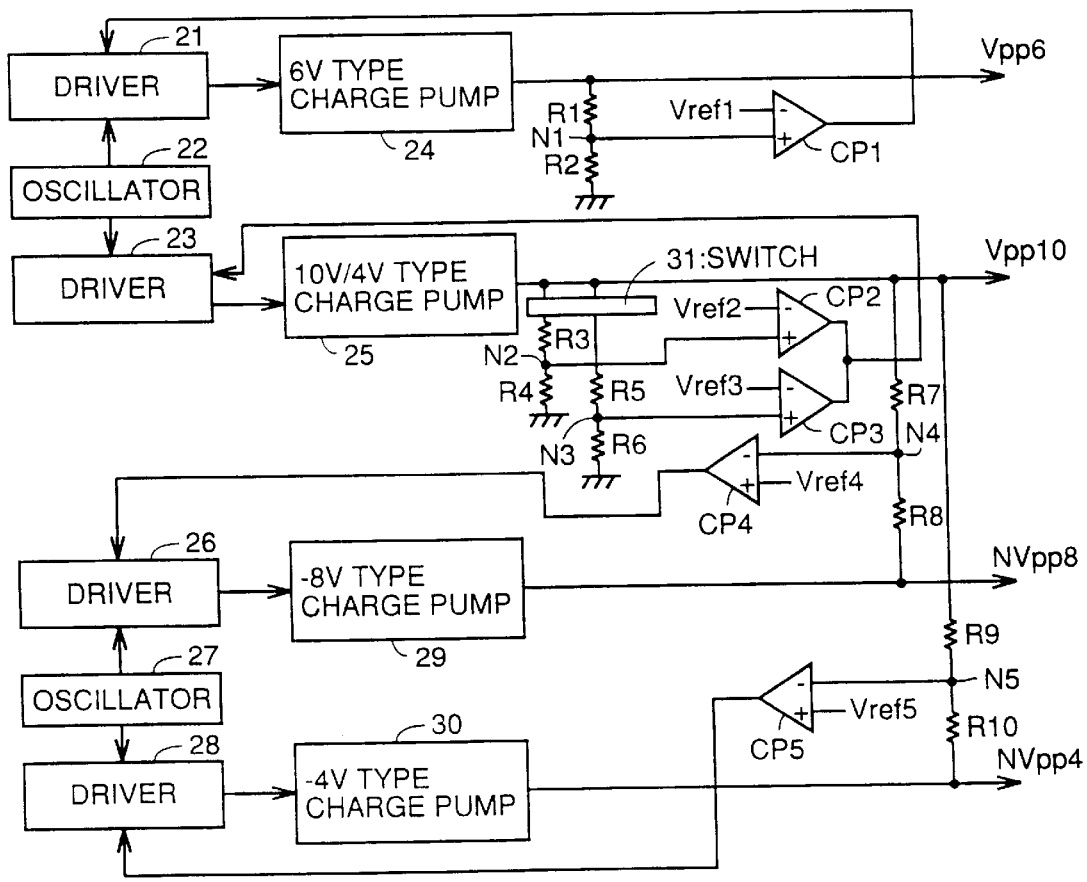
FIG. 15 is a block diagram showing another internal voltage generation unit of the semiconductor device of FIG. 2.

Another example of an internal voltage generation unit of the semiconductor device of FIG. 2 will be described hereinafter with reference to FIG. 15. The internal voltage generation unit of FIG. 15 differs from the internal voltage generation unit of FIG. 11 in that resistors R1–R10 for resistance-division is provided instead of capacitors C1–10 used for capacitance-division. The remaining components in FIG. 15 are similar to those in FIG. 1 and operate in a similar manner. Therefore, their description will not be repeated. In the internal voltage generation unit of FIG. 15, output voltages $V_{PP6}$ and $V_{PP10}$ which are positive voltages and output voltages $NV_{PP8}$ and $NV_{PP4}$ which are negative voltages can be clamped using the voltages of nodes N1–N10 which are positive voltages and the reference voltages of Vref1–Vref5. It is therefore possible to generate internal voltages of 6V, 10V, 4V, –8V and –4V using a single voltage power supply source, for example, a positive voltage of 3V.

An internal voltage generation unit of a semiconductor device according to another embodiment of the present invention will be described hereinafter with reference to FIG. 9.

Figure 9:
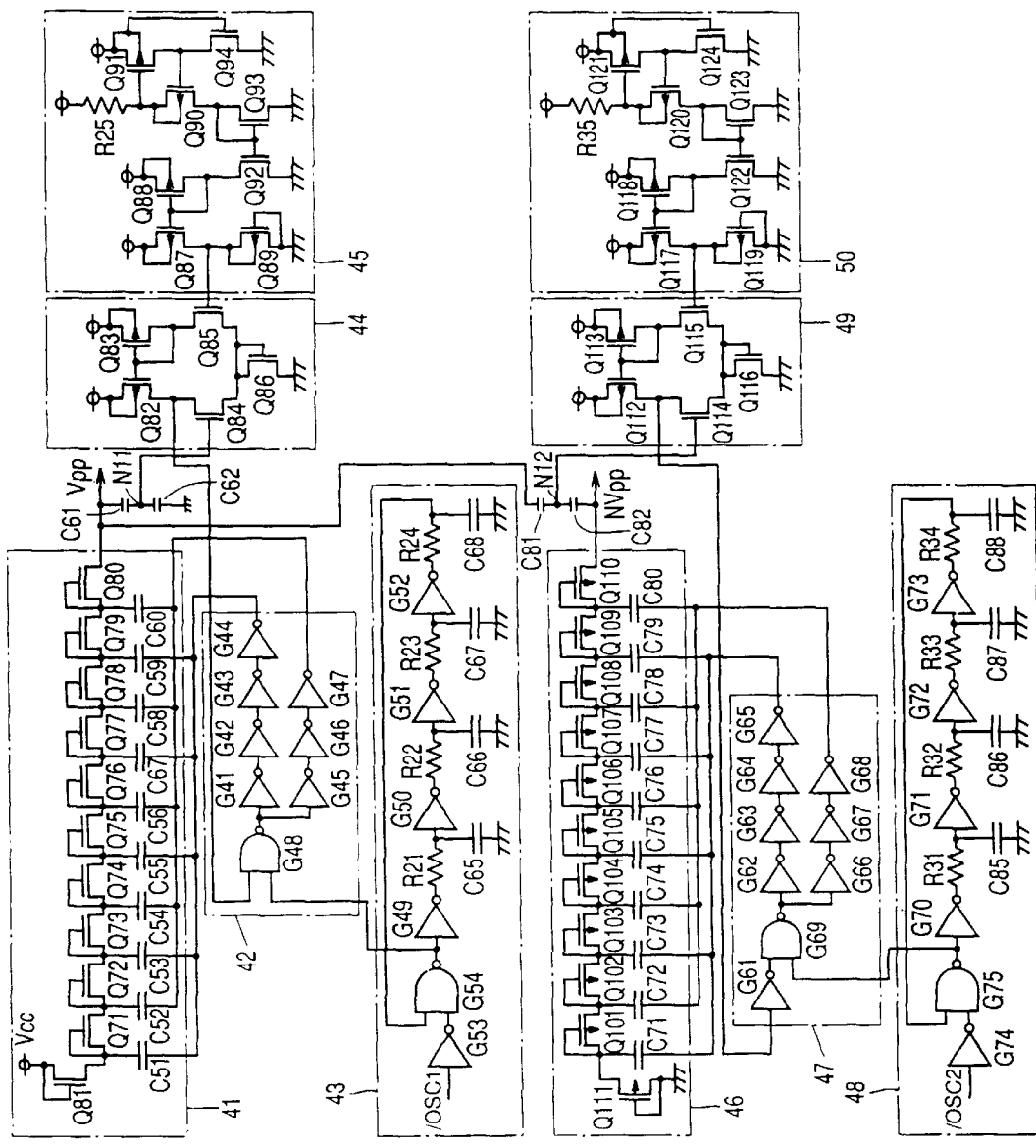
FIG. 9 shows a structure of an internal voltage generation unit of a semiconductor device according to another embodiment of the present invention.

Referring to FIG. 9, an internal voltage generation unit includes a positive voltage charge pump circuit 41, drivers 42 and 47, oscillators 43 and 48, comparators 44 and 49, and reference voltage generation circuits 45 and 50.

Oscillator 43 includes inverters G49–G53, resistors R21–R24, capacitors C65–C68, and an NAND gate G54. Oscillator 43 operates in the manner similar to the oscillator of FIG. 3, and provides a clock signal of a predetermined frequency to driver 42 in response to control signal /OSC1.

Driver 42 includes inverters G41–G47, and an NAND gate G48. Driver 42 operates in a manner similar to the driver of FIG. 4, and provides complementary clock signals to positive voltage charge pump circuit 41 in response to a clock signal provided when the output of comparator 44 attains a H level.

Positive voltage charge pump circuit 41 includes NMOS transistors Q71–Q81, and capacitors C51–C60. Positive voltage charge pump circuit 41 operates in a manner similar to the positive voltage charge pump circuit of FIG. 7, and provides an output voltage $V_{PP}$ which is a boosted positive voltage in response to complementary clock signals.

The voltage between output voltage $V_{PP}$ and ground voltage is capacitance-divided by capacitors C61 and C62.

The capacitance-divided voltage of node N11 is applied to comparator 44. The capacitances of capacitors C61 and C62 are set to a predetermined value similar to capacitors C1 and C2 of FIG. 1.

Reference voltage generation circuit 45 includes a resistor R25, PMOS transistors Q87–Q91, and NMOS transistors Q92–Q94. Reference voltage generation circuit 45 operates in manner similar to the reference voltage generation circuit of FIG. 6, and provides a reference voltage to comparator 44. The reference voltage is set according to a clamping voltage similar to reference voltage Vref1 of FIG. 1.

Comparator 44 includes PMOS transistor Q82 and Q83, and NMOS transistors Q84–Q86. The voltage of node N11 applied to the gate of transistor Q84 is compared with the reference voltage applied to the gate of transistor Q85. When the voltage of node N11 is greater than the reference voltage, comparator 44 provides a signal of a H level to driver 42.

Driver 42 and positive voltage charge pump circuit 41 operate in a manner similar to driver 21 and 6V type charge pump 24 of FIG. 1 to clamp output voltage $V_{PP}$ at a predetermined positive voltage.

Oscillator 48 includes inverters G70–G74, an NAND gate G75, resistors R31–R34, and capacitors C85–C88. Oscillator 48 operates in a manner similar to the oscillator of FIG. 3, and provides a clock signal of a predetermined frequency to driver 47 in response to a control signal /OSC2.

Driver 47 includes inverters G61–G68, and an NAND gate 69. Driver 47 operates in a manner similar to the driver of FIG. 7 to provide complementary clock signals to negative voltage charge pump circuit 46 in response to an input clock signal when the output signal of comparator 49 attains a L level.

Negative voltage charge pump circuit 46 includes PMOS transistors Q101–Q111, and capacitors C71–C80. Negative voltage charge pump circuit 46 responds to the input complementary clock signals to provide an output voltage $NV_{PP}$ which is a negative down-converted voltage.

The voltage between output voltage $V_{PP}$ and output voltage $NV_{pp}$ is capacitance-divided by capacitors C81 and C82. The capacitances of capacitors C81 and C82 are set so that the voltage of node N12 attains a positive voltage similar to capacitors C7 and C8 of FIG. 1. The voltage of node N12 is applied to comparator 49.

Reference voltage generation circuit 50 includes a resistor R35, PMOS transistors Q117–Q121, and NMOS transistors Q122–Q124. Reference voltage generation circuit 50 provides a reference voltage set to a predetermined level to comparator 49, similar to the reference voltage generation circuit of FIG. 6.

Comparator 49 includes PMOS transistors Q112 and Q113, and NMOS transistors Q114–Q116. Comparator 49 compares the voltage of node N12 applied to the gate of transistor Q114 with the reference voltage applied from reference voltage generation circuit 50. When the voltage of node N12 becomes lower than the reference voltage, a signal of a H level is provided to driver 47.

Drivers 47 and negative voltage charge pump circuit 46 operate in a manner similar to the driver and the negative voltage charge pump circuit of FIG. 7, and clamp output voltage $NV_{PP}$ at a predetermined negative voltage.

By the above operation, the internal voltage generation unit of FIG. 9 can clamp a boosted positive voltage and a negative down-converted voltage at predetermined levels for output using only a positive voltage. It is therefore possible to output a positive down-converted voltage and a negative boosted voltage using only a single power supply voltage of 3V.

Figure 10:
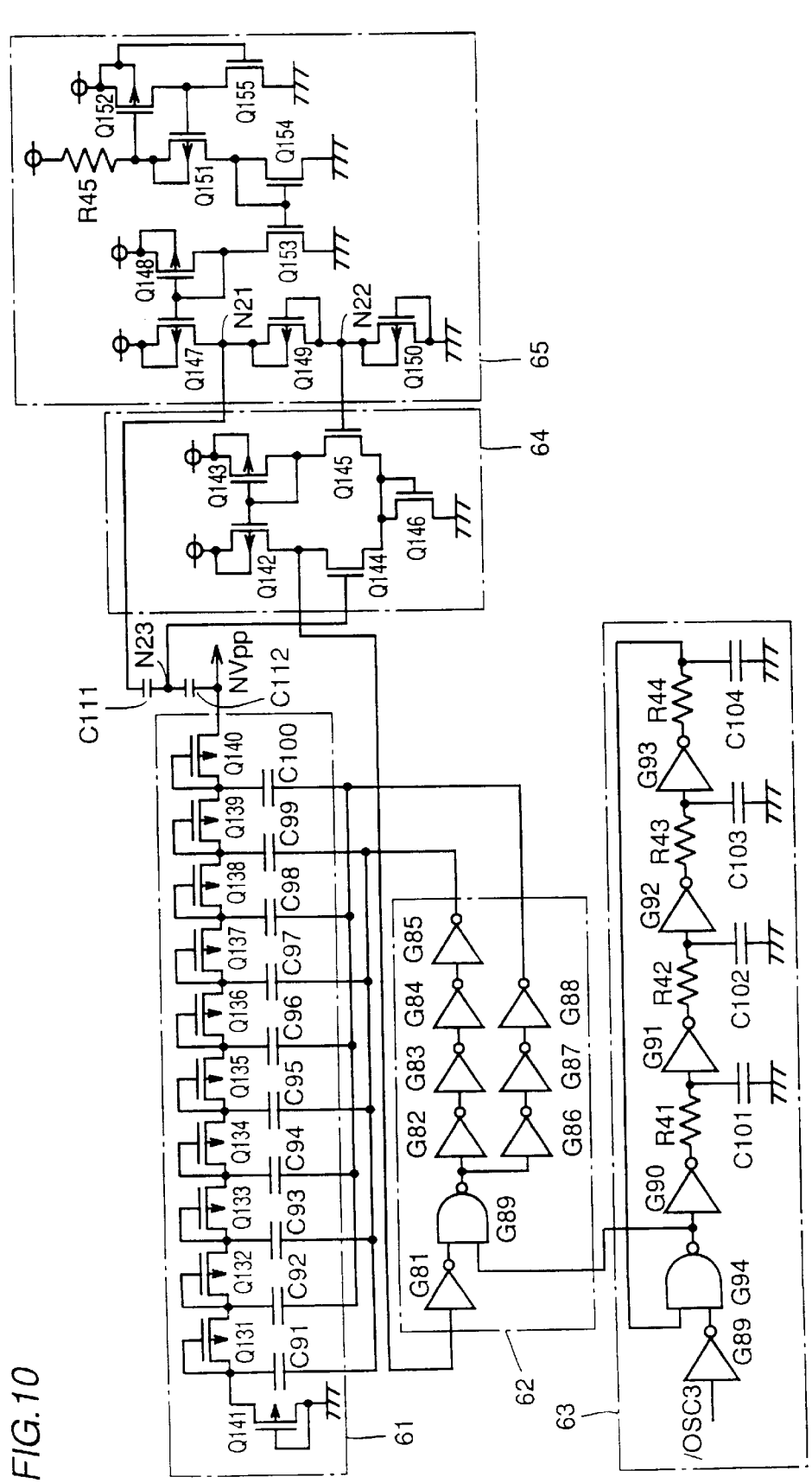
FIG. 10 shows a structure of an internal voltage generation unit of a semiconductor device according to a further embodiment of the present invention.

An internal voltage generation unit of a semiconductor device according to a further embodiment of the present invention will be described with reference to FIG. 10 showing the structure thereof.

Referring to FIG. 10, an internal voltage generation unit includes a negative voltage charge pump circuit 61, a driver 62, an oscillator 63, a comparator 64, and a reference voltage generation circuit 65.

An oscillator 63 includes inverters G89–G93, an NAND gate G94, resistors R41–R44, and capacitors C101–C104. Oscillator 63 operates in a manner similar to the oscillator of FIG. 3, and provides a clock signal of a predetermined frequency to driver 42 in response to a control signal /OSC3.

Driver 62 includes inverters G81–G88, and an NAND gate G89. Driver 62 operates in a manner similar to the driver of FIG. 7, and provides complementary clock signals to negative voltage charge pump circuit 61 in response to an input clock signal when the output signal of comparator 64 attains a L level.

Negative voltage charge pump circuit 61 includes PMOS transistors Q131–Q141, and capacitors C91–C100. Negative voltage charge pump circuit 61 operates in a manner similar to the negative voltage charge pump circuit of FIG. 7, and provides an output voltage $NV_{PP}$ which is a down-converted negative voltage in response to complementary clock signals.

Reference voltage generation circuit 65 includes PMOS transistors Q147–Q152, NMOS transistors Q135–Q155, and a resistor R45. Similar to the reference voltage generation circuit of FIG. 6, reference voltage generation circuit 65 generates a reference voltage for comparator 64 from node N22 and a reference voltage for capacitance-division from node N21. Here, the voltages of N21 and N22 are both set to attain a positive voltage.

Capacitors C111 and C112 capacitance-divide the voltage between node N21 and output voltage $NV_{PP}$. The capacitance-divided voltage of node N23 is applied to comparator 64.

Comparator 64 includes PMOS transistors Q142 and Q143, and NMOS transistors Q144–Q146. Comparator 64 compares the voltage of node N23 applied to the gate of transistor Q114 with the voltage of node N22 applied to the gate of transistor Q145. When the voltage of node N23 becomes lower than the voltage of node N22, a signal of a H level is applied to driver 62. The capacitances of capacitors C111 and C112 are set so that the voltage of node N23 is positive, similar to capacitors C7 and C8 of FIG. 1.

Driver 62 suppresses an output of complementary clock signals when the output signal from comparator 64 attains a H level. This will result in a cessation of voltage-down operation of negative voltage charge pump circuit 61. When the voltage of node N23 is greater than the voltage of node N22, the output signal of comparator 64 attains a L level, whereby driver 62 and negative voltage charge pump circuit 61 reinitiate their operation to carry out a voltage-down operation. By the above-described operation, output voltage $NV_{PP}$ is clamped at a predetermined negative voltage level for output.

The internal voltage generation unit of FIG. 10 can clamp a down-converted negative voltage at a predetermined voltage level by using only a positive voltage. Therefore, it is possible to generate stably an internal negative voltage using a single positive power supply voltage. Because the voltage of node N21 can be output in high accuracy and stably, the clamp level is also accurate and stable.

In the above embodiments, a positive or a negative voltage can be clamped using only a capacitance-divided positive voltage. A Zener diode is not necessary. Therefore, a desired internal voltage can be provided at high accuracy. Also, the manufacturing process is simplified because a dedicated mask or the like is not required. Therefore, the manufacturing cost can be reduced. Furthermore, a stable internal voltage can be provided using a charge pump circuit limited in current supplying ability since a desired internal voltage can be provided without conducting an extra current flow.

Although the above embodiments are described in which a power supply voltage of a positive level is used, a positive voltage can be clamped using a power supply voltage of a negative level. Furthermore, a method using a conventional Zener diode and the above-described method of dividing the voltage may be employed together.

Although an MOS transistor (for example, NMOS transistors Q21–Q31 shown in FIG. 4, PMOS transistors Q51–Q61 shown in FIG. 7, etc.) is used for charge transfer in each of the above-described charge pump circuit, a diode may be used instead. Furthermore, an MOS capacitor or a parallel plate type capacitor may be used for the capacitor that stores charge (for example, capacitors C21–C30 shown in FIG. 4, capacitors C31–C40 shown in FIG. 7).

Although a flash memory was described in the above embodiments, the present invention is applicable to other semiconductor devices, for example a DRAM (Dynamic Random Access Memory).

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
    first charge pump means for generating a first voltage of a first polarity,
    voltage generation means for generating a second voltage of a second polarity differing from said first polarity,
    first voltage-dividing means for generating a third voltage of said second polarity by voltage-division from said first and second voltages, and
    first control means for controlling an operation of said first charge pump means in response to a level of said third voltage.

2. The semiconductor device according to claim 1, wherein said first voltage-dividing means generates said third voltage which is between a ground voltage and a power supply voltage.

3. The semiconductor device according to claim 1, wherein said semiconductor device receives an externally applied single power supply voltage,
    wherein said first charge pump means generates said first voltage by using said single power supply voltage, and
    wherein said voltage generation means generates said second voltage using said single power supply voltage, said second voltage having a polarity equal to that of said single power supply voltage.

4. The semiconductor device according to claim 3, wherein said single power supply voltage is a positive voltage.

5. The semiconductor device according to claim 1, wherein said semiconductor device comprises a flash memory.

6. The semiconductor device according to claim 1, wherein said first voltage-dividing means comprises:

a first capacitor circuit, having first and second ends, said first voltage being applied to the first end, and a second capacitor circuit having a first end connected to the second end of said first capacitor circuit, and a second end supplied with said second voltage, wherein said third voltage is generated from a connection portion of said first and second capacitor circuit.

7. The semiconductor device according to claim 6, wherein said first charge pump means comprises first transfer means for transferring charge, and having a predetermined voltage supplied to a first end, a plurality of second transfer means connected to said first transfer means for transferring charge, each second transfer means connected in series, and a plurality of third capacitor circuits, each connected to a corresponding second transfer means.

8. The semiconductor device according to claim 7, wherein a capacitance of each of said first and second capacitor circuits is smaller than a capacitance of each of said plurality of third capacitor circuits.

9. The semiconductor device according to claim 1, wherein said first control means comprises first clock signal generation means for generating a first predetermined clock signal in response to a control signal, first complementary signal output means responsive to said first clock signal for providing first signals complementary to each other to drive said first charge pump means, first reference voltage generation means for generating a predetermined first reference voltage and first comparison means for comparing said third voltage with said predetermined first reference voltage to control operation of said first complementary signal output means in response to a first comparison result.

10. The semiconductor device according to claim 1, wherein said voltage generation means comprises second charge pump means for generating said second voltage, voltage providing means for providing a fourth voltage, second voltage-dividing means for generating a fifth voltage of said second polarity by voltage-division from said second and fourth voltages, and second control means for controlling operation of said second charge pump means according to said fifth voltage.

11. The semiconductor device according to claim 10, wherein said first control means comprises first clock signal generation means for generating a predetermined first clock signal in response to a first control signal, first complementary signal output means responsive to said first clock signal for providing first signals complementary to each other to drive said first charge pump means, first reference voltage generation means for generating a predetermined first reference voltage and first comparison means for comparing said third voltage with said first reference voltage to control operation of said first complementary signal output means in response to a first comparison result, wherein said second control means comprises second clock signal generation means for generating a predetermined second clock signal in response to a second control signal, second complementary signal output means responsive to said second clock signal for providing second signals complementary to each other to drive said second charge pump means, second reference voltage generation means for generating a predetermined second reference voltage, and second comparison means for comparing said fifth voltage with said second reference voltage to control operation of said second complementary signal output means in response to a second comparison result.

12. The semiconductor device according to claim 1, wherein said voltage generation means further comprises second voltage generation means for generating a fourth voltage of said second polarity, wherein said first control means comprises clock signal generation means for generating a predetermined clock signal in response to a control signal, complementary signal output means, responsive to said clock signal, for providing signals complementary to each other to drive said first charge pump means, and comparison means for comparing said third voltage with a reference voltage to control operation of said complementary signal output means in response to a comparison result.

13. The semiconductor device according to claim 1, wherein said voltage-dividing means comprises a first resistor having said first voltage applied to a first end, and a second resistor having a first end connected to a second end of said first resistor, and a second end applied with said second voltage, wherein said third voltage is generated from a connection portion of said first and second resistors.

14. A semiconductor device comprising:

first charge pump means for generating a first positive voltage, first voltage-dividing means for providing a second positive voltage by capacitance-division from said first positive voltage and a ground voltage, first control means for controlling operation of said first charge pump means in response to said second positive voltage, second charge pump means for generating a negative voltage, second voltage-dividing means for producing a third positive voltage by capacitance-division from said negative voltage and said first positive voltage, and second control means for controlling operation of said second charge pump means according to said third positive voltage.

15. A semiconductor device comprising:

first charge pump means for generating a first positive voltage, first voltage-dividing means for providing a second positive voltage by capacitance-division from said first positive voltage and a ground voltage, first control means for controlling operation of said first charge pump means according to said second positive voltage, second charge pump means for generating a third positive voltage, second voltage-dividing means for generating a fourth positive voltage by capacitance-division from said third positive voltage and a ground voltage, second control means for controlling operation of said second charge pump means according to said fourth positive voltage, third charge pump means for generating a first negative voltage, third voltage-dividing means for providing a fifth positive voltage by capacitance-division from said first negative voltage and said third positive voltage, third control means for controlling operation of said third charge pump means according to said fifth positive voltage, fourth charge pump means for generating a second negative voltage, fourth voltage-dividing means for providing a sixth positive voltage by capacitance-division from said second negative voltage and said third positive voltage, and fourth control means for controlling operation of said fourth charge pump means according to said sixth positive voltage.

16. The semiconductor device according to claim 15, wherein said second charge pump means selectively generates one of a seventh positive voltage and an eighth positive voltage generated as said third positive voltage according to an operation state of the device, wherein said second voltage-dividing means comprises first capacitance-dividing means for providing a ninth positive voltage by capacitance-division from said seventh positive voltage and a ground voltage, second capacitance-dividing means for providing a tenth positive voltage by capacitance-division from said eighth positive voltage and the ground voltage, and selecting means for selectively providing one of said ninth positive voltage and said tenth positive voltage as said fourth positive voltage to said second control means according to said operation state.

17. The semiconductor device according to claim 16, wherein said semiconductor device comprises a flash memory and wherein said first positive voltage, said seventh positive voltage, said ninth positive voltage, said first negative voltage, and said second negative voltage are provided to a transistor forming a memory cell in an erasing operation and a writing operation.

* * * * *